United States Patent
Yokota et al.

(10) Patent No.: US 10,461,001 B2
(45) Date of Patent: Oct. 29, 2019

(54) METHOD FOR MANUFACTURING HERMETIC SEALING LID MEMBER, AND METHOD FOR MANUFACTURING ELECTRONIC COMPONENT HOUSING PACKAGE

(71) Applicant: HITACHI METALS, LTD., Tokyo (JP)

(72) Inventors: Masayuki Yokota, Suita (JP); Masaharu Yamamoto, Suita (JP)

(73) Assignee: HITACHI METALS, LTD., Tokyo (JP)

( * ) Notice: Subject to any disclaimer, the term of this patent is extended or adjusted under 35 U.S.C. 154(b) by 64 days.

(21) Appl. No.: 15/527,779

(22) PCT Filed: Nov. 17, 2015

(86) PCT No.: PCT/JP2015/082189
§ 371 (c)(1),
(2) Date: May 18, 2017

(87) PCT Pub. No.: WO2016/093021
PCT Pub. Date: Jun. 16, 2016

(65) Prior Publication Data
US 2017/0330811 A1  Nov. 16, 2017

(30) Foreign Application Priority Data

Dec. 11, 2014  (JP) ................................ 2014-250728

(51) Int. Cl.
H05K 5/06  (2006.01)
H01L 23/10  (2006.01)
(Continued)

(52) U.S. Cl.
CPC .............. *H01L 23/10* (2013.01); *H01L 23/02* (2013.01); *H01L 23/04* (2013.01); *H01L 23/06* (2013.01);
(Continued)

(58) Field of Classification Search
CPC ......... H01L 23/10; H01L 23/02; H01L 23/04; H01L 23/06; H01L 2224/16;
(Continued)

(56) References Cited

U.S. PATENT DOCUMENTS 7,065,867 B2 *  6/2006  Kim .................... B81C 1/00269
174/250
7,173,331 B2 *  2/2007  Matsubara .............. H01L 21/50
257/704
(Continued)

FOREIGN PATENT DOCUMENTS

GB    2073082 A    10/1981
JP    61-223199 A    10/1986
(Continued)

OTHER PUBLICATIONS

Office Action dated May 9, 2018, issued in counterpart Korean Application No. 10-2017-7012480, with English translation. (22 pages).
(Continued)

*Primary Examiner* — Angel R Estrada
(74) *Attorney, Agent, or Firm* — Westerman, Hattori, Daniels & Adrian, LLP (57) ABSTRACT

This method for manufacturing a hermetic sealing lid member (1, 201, 301) includes forming a Ni plated metal plate (70, 170) by forming a Ni plated layer (11, 12, 41) on a surface of a metal plate (40) having a corrosion resistance and forming the hermetic sealing lid member by punching the Ni plated metal plate.

11 Claims, 7 Drawing Sheets

(51) Int. Cl.
  *H01L 23/02* (2006.01)
  *H03H 3/02* (2006.01)
  *H03H 9/02* (2006.01)
  *H01L 23/04* (2006.01)
  *H01L 23/06* (2006.01)
  *H03H 9/10* (2006.01)
  *H03H 9/13* (2006.01)

(52) U.S. Cl.
  CPC ............... *H03H 3/02* (2013.01); *H03H 9/02* (2013.01); *H03H 9/1071* (2013.01); *H03H 9/133* (2013.01); *H01L 2224/16* (2013.01); *H01L 2924/0002* (2013.01); *H01L 2924/01028* (2013.01); *H01L 2924/0132* (2013.01); *H01L 2924/16195* (2013.01)

(58) Field of Classification Search
  CPC ... H01L 2924/0002; H01L 2924/01028; H01L 2924/0132; H01L 2924/16195; H03H 3/02; H03H 9/02; H03H 9/1071; H03H 9/133; H05K 1/00; H05K 1/02; H05K 1/03; H05K 1/11; H05K 3/00; H05K 3/02; H05K 3/04
  USPC ..... 174/520, 50, 50.5, 50.51, 535, 539, 255, 174/256, 260; 29/592.1, 592; 428/679
  See application file for complete search history.

(56) References Cited

U.S. PATENT DOCUMENTS

| | | | | |
|---|---|---|---|---|
| 7,790,988 B2* | 9/2010 | Tanaka | ................ | H01L 21/4817 |
| | | | | 174/564 |
| 8,431,820 B2* | 4/2013 | Yamamoto | .............. | H01L 23/06 |
| | | | | 174/50.5 |
| 8,881,935 B2* | 11/2014 | Trescher | ............... | H01L 23/049 |
| | | | | 174/50.56 |
| 10,014,189 B2* | 7/2018 | Suzuki | .................... | H01L 23/10 |
| 2004/0224436 A1 | 11/2004 | Naito | | |
| 2005/0062067 A1 | 3/2005 | Kunda et al. | | |
| 2015/0232244 A1* | 8/2015 | Yokota | .................. | B65D 65/38 |
| | | | | 428/678 |

FOREIGN PATENT DOCUMENTS

| | | |
|---|---|---|
| JP | 63-104721 A | 5/1988 |
| JP | 4-96256 A | 3/1992 |
| JP | 5-275603 A | 10/1993 |
| JP | 11-240653 A | 9/1999 |
| JP | 2000-236035 A | 8/2000 |
| JP | 2000-236228 A | 8/2000 |
| JP | 2004-186995 A | 7/2004 |
| JP | 2004-342971 A | 12/2004 |
| JP | 2005-101192 A | 4/2005 |
| WO | 2014/073665 A1 | 5/2014 |

OTHER PUBLICATIONS

Office Action dated Jul. 10, 2017, issued in counterpart Taiwanese Application No. 104141510, with English translation (14 pages).
Office Action dated Jan. 23, 2018, issued in counterpart Japanese Application No. 2014-250728, with English machine translation. (9 pages).
Office Action dated May 23, 2017, issued in counterpart Japanese Application No. 2014-250728, with English translation. (13 pages).
Extended (supplementary) European Search Report dated Jul. 9, 2018, issued in counterpart European Application No. 15866889.7. (9 pages).
International Search Report dated Dec. 28, 2015, issued in counterpart International Application No. PCT/JP2015/082189 (2 pages).

* cited by examiner

[HOOP PLATING PROCESSING]

| MATERIALS FOR BASE MATERIAL LAYER | SALT SPRAY TEST | | | | EVALUATION | |
|---|---|---|---|---|---|---|
| | 24 h | 48 h | 72 h | 144 h | | |
| 36Ni-6Cr-Fe | ○ | △ | — | — | ○ | BASE MATERIAL LAYER ACCORDING TO FIRST AND SECOND EMBODIMENTS |
| 38Ni-6Cr-Fe | ○ | △ | — | — | ○ | |
| 40Ni-6Cr-Fe | ○ | ○ | — | — | ◎(*) | |
| 42Ni-4Cr-Fe | ○ | ○ | △ | — | ◎ | |
| 42Ni-6Cr-Fe | ○ | ○ | ○ | ○ | * | |
| 47Ni-6Cr-Fe | ○ | ○ | — | — | ◎(*) | |
| 29Ni-17Co-6Cr-Fe | ○ | ○ | — | — | ◎ | |
| 18Cr-Fe(SUS430) | ○ | ○ | — | — | ◎ | |
| 29Ni-16Co-Fe (KOVAR) | × | — | — | — | × | COMPARATIVE EXAMPLE |

FIG.13

| MATERIALS FOR BASE MATERIAL LAYER | AVERAGE THERMAL EXPANSION COEFFICIENTS (×10⁻⁶/K) | | | |
|---|---|---|---|---|
| | 30°C~300°C | 30°C~400°C | 30°C~500°C | |
| 36Ni-6Cr-Fe | 10.8 | 12.4 | 13.4 | BASE MATERIAL LAYER ACCORDING TO FIRST AND SECOND EMBODIMENTS |
| 38Ni-6Cr-Fe | 9.4 | 11.2 | 12.4 | |
| 40Ni-6Cr-Fe | 8.5 | 10.3 | 11.7 | |
| 42Ni-4Cr-Fe | 7.2 | 9.0 | 10.5 | |
| 42Ni-6Cr-Fe | 8.1 | 10.0 | 11.3 | |
| 47Ni-6Cr-Fe | 9.0 | 10.0 | 11.1 | |
| 29Ni-17Co-6Cr-Fe | 5.8 | 6.5 | 8.4 | |
| 18Cr-Fe(SUS430) | 11.0 | 11.1 | 11.3 | |
| 29Ni-16Co-Fe (KOVAR) | 5.1 | 4.9 | 6.1 | COMPARATIVE EXAMPLE |
| ALUMINA (Al₂O₃) | ---- | 7.2 | ---- | REFERENCE EXAMPLE (OBJECT TO BE WELDED) |

STUDY OF BASE MATERIAL LAYER (THERMAL EXPANSIBILITY)

FIG.14 FIRST MODIFICATION

FIG.15 SECOND MODIFICATION

METHOD FOR MANUFACTURING HERMETIC SEALING LID MEMBER, AND METHOD FOR MANUFACTURING ELECTRONIC COMPONENT HOUSING PACKAGE

TECHNICAL FIELD

The present invention relates to a method for manufacturing a hermetic sealing lid member formed with a Ni plated layer, the hermetic sealing lid member, and a method for manufacturing an electronic component housing package using the hermetic sealing lid member.

BACKGROUND ART

A hermetic sealing lid member formed with a Ni plated layer is known in general. Such a hermetic sealing lid member is disclosed in Japanese Patent Laid-Open No. 2005-101192, for example.

Japanese Patent Laid-Open No. 2005-101192 discloses a lid member used for an acceleration sensor device (electronic component housing package) in which a sensor chip is housed, in which a Ni plated layer is formed in a kovar member. In Japanese Patent Laid-Open No. 2005-101192, Ni plating processing is performed by an electroplating method or the like after the kovar member is formed in a predetermined shape by pressing such that the lid member in which the Ni plated layer is formed in the kovar member is formed. Although not clearly described in Japanese Patent Laid-Open No. 2005-101192, as the Ni plating processing for the kovar member, a common barrel Ni plating processing in which a barrel is rotated, for example, in a state where a plurality of kovar members formed in the predetermined shape in advance is put in the barrel such that the Ni plated layer is formed on the entire surface of each of the plurality of kovar members is conceivably performed.

PRIOR ART DOCUMENT

Patent Document

Patent Document 1: Japanese Patent Laying-Open No. 2005-101192

SUMMARY OF THE INVENTION

Problem to be Solved by the Invention

However, when the common barrel Ni plating processing is performed in a method for manufacturing the lid member described in Japanese Patent Laid-Open No. 2005-101192, the kovar members formed in the predetermined shape in advance overlap with each other in the barrel such that regions of the lid member on which the Ni plated layer is insufficiently formed may be disadvantageously generated. In this case, the kovar members are exposed on the regions on which the Ni plated layer is insufficiently formed such that corrosion of the kovar members proceeds readily from the regions on which the Ni plated layer is insufficiently formed. Consequently, when the lid member is used for the acceleration sensor device, there is conceivably such a problem that the hermetic sealability of the acceleration sensor device is not maintained due to corrosion of the lid member.

The present invention has been proposed in order to solve the aforementioned problem, and an object of the present invention is to provide a method for manufacturing a hermetic sealing lid member capable of effectively suppressing corrosion of the hermetic sealing lid member even when the hermetic sealing lid member has an exposed portion on which no Ni plated layer is formed, the hermetic sealing lid member formed by the manufacturing method, and a method for manufacturing an electronic component housing package using the hermetic sealing lid member.

Means for Solving the Problem

A method for manufacturing a hermetic sealing lid member according to a first aspect of the present invention is a method for manufacturing a hermetic sealing lid member used for an electronic component housing package in which an electronic component is housed, and includes forming a Ni plated metal plate by forming a Ni plated layer on a surface of a metal plate having a corrosion resistance and forming the hermetic sealing lid member by punching the Ni plated metal plate. The term "metal plate having a corrosion resistance" indicates a wider concept including not only metal hardly corroded by a salt spray test or the like but also metal slightly corroded by the salt spray test or the like but only corroded to an extent where hermetic sealing is possible (an extent where no practical problem is caused).

In the method for manufacturing the hermetic sealing lid member according to the first aspect of the present invention, as hereinabove described, the Ni plated metal plate is formed by forming the Ni plated layer on the surface of the metal plate having a corrosion resistance before the punching, and the hermetic sealing lid member is formed by punching the Ni plated metal plate, whereby no Ni plated layer is formed on a side surface of the hermetic sealing lid member after the punching, and the metal plate is exposed. Furthermore, regions (portions on which the metal plate is exposed) on which the Ni plated layer is insufficiently formed may be generated on the hermetic sealing lid member when the Ni plated metal plate is formed. In this case, in the method for manufacturing the hermetic sealing lid member according to the first aspect, the metal plate 40 has a corrosion resistance, and hence progression of corrosion of the metal plate from the portions on which the metal plate is exposed can be effectively suppressed. Thus, the hermetic sealing lid member, the corrosion of which is effectively suppressed, can be obtained, and hence the hermetic sealability of the electronic component housing package using the hermetic sealing lid member can be maintained. Furthermore, the hermetic sealing lid member is formed by forming the Ni plated layer on the belt-like metal plate to form the belt-like Ni plated metal plate and thereafter punching the belt-like Ni plated metal plate, for example, whereby the belt-like Ni plated metal plate can be continuously formed, and the hermetic sealing lid member can be continuously prepared by the continuous punching. Thus, the production efficiency of the hermetic sealing lid member, the corrosion of which is effectively suppressed, can be improved.

The aforementioned method for manufacturing the hermetic sealing lid member according to the first aspect preferably further includes slitting in which the metal plate or the Ni plated metal plate is cut into a plurality of the metal plates or a plurality of the Ni plated metal plates. According to this structure, the metal plate or the Ni plated metal plate can be easily cut to a width that corresponds to the size of the hermetic sealing lid member by the slitting. When the belt-like metal plate or the belt-like Ni plated metal plate is used, the slitting can be continuously performed, and hence the metal plate or the Ni plated metal plate can be more easily cut to the width that corresponds to the size of the hermetic sealing lid member.

In this case, the slitting preferably includes slitting the metal plate or the Ni plated metal plate such that the metal plate or the Ni plated metal plate on which the slitting has been performed has a width larger by a machining allowance of at least twice a thickness of the hermetic sealing lid member than a width of the hermetic sealing lid member. According to this structure, an excessive reduction in the machining allowance of the Ni plated metal plate can be suppressed, and hence occurrence of torsion and warpage in the Ni plated metal plate at the time of punching can be suppressed. Thus, occurrence of a burr in a punched portion of the hermetic sealing lid member at the time of punching can be suppressed, and an increase in the warpage of the hermetic sealing lid member after the punching can be suppressed.

In the aforementioned method for manufacturing the hermetic sealing lid member according to the first aspect, the forming of the Ni plated metal plate preferably includes forming the Ni plated layer on the surface of the metal plate by electrolytic Ni plating processing. According to this structure, the Ni plated layer having a sufficient thickness can be reliably formed as compared with electroless Ni plating processing, and hence generation of regions on which the Ni plated layer is insufficiently formed can be effectively suppressed. Thus, the hermetic sealing lid member, the corrosion of which is effectively suppressed, can be obtained. Furthermore, as compared with the electroless Ni plating processing, the Ni plated layer containing Ni of high purity and having lower impurities can be formed.

In the aforementioned method for manufacturing the hermetic sealing lid member according to the first aspect, the forming of the Ni plated metal plate preferably includes forming the Ni plated layer on both or one of an upper surface and a lower surface of the metal plate having the corrosion resistance, and the forming of the hermetic sealing lid member by the punching preferably includes forming, by the punching of the Ni plated metal plate, the hermetic sealing lid member in which the Ni plated layer is not formed on a side surface of the hermetic sealing lid member but is formed on both or one of an upper surface and a lower surface of the hermetic sealing lid member. In even this hermetic sealing lid member in which at least the side surface thereof is formed with no Ni plated layer such that the portions on which the metal plate is exposed are generated, the metal plate has a corrosion resistance, and hence progression of corrosion of the metal plate from the exposed portions can be effectively suppressed. Thus, the hermetic sealing lid member, the corrosion of which is effectively suppressed, can be obtained.

In the aforementioned method for manufacturing the hermetic sealing lid member according to the first aspect, the forming of the Ni plated metal plate preferably includes continuously forming the Ni plated layer on the surface of the metal plate that is belt-like. According to this structure, the production efficiency of the hermetic sealing lid member, the corrosion of which is effectively suppressed, can be improved.

In the aforementioned method for manufacturing the hermetic sealing lid member according to the first aspect, the forming of the Ni plated metal plate preferably includes setting a thickness of the Ni plated layer to 1% or more and 12.5% or less of a thickness of the metal plate. The forming of the Ni plated metal plate more preferably includes setting the thickness of the Ni plated layer to 2.5% or more and 7.5% or less of the thickness of the metal plate. According to this structure, the thickness of the Ni plated layer can be sufficiently ensured by setting the thickness of the Ni plated layer to 1% (2.5%) or more of the thickness of the metal plate, and hence the hermetic sealing lid member can be melted with a sufficient welding strength when the hermetic sealing lid member is welded by melting the Ni plated layer while the corrosion resistance of the surface of the metal plate on which the Ni plated layer is formed can be further improved. Furthermore, the time required for a step of forming the Ni plated layer can be reduced by setting the thickness of the Ni plated layer to 12.5% (7.5%) or less of the thickness of the metal plate, and hence the production efficiency of the hermetic sealing lid member can be improved.

In the aforementioned method for manufacturing the hermetic sealing lid member further including the slitting, the slitting is preferably performed after the forming of the Ni plated metal plate and before the forming of the hermetic sealing lid member. According to this structure, the slitting is performed after the Ni plated layer is formed on the metal plate such that the plurality of Ni plated metal plates can be easily formed. Furthermore, the Ni plated layer is not formed on the side surface of each of the Ni plated metal plates after the slitting, and hence the amount of Ni plating used can be reduced as compared with the case where the slitting is performed before the forming of the Ni plated metal plates.

In the aforementioned method for manufacturing the hermetic sealing lid member further including the slitting, the slitting is preferably performed before the forming of the Ni plated metal plate. According to this structure, Ni plating processing can be performed on only a portion of the plurality of metal plates on which the slitting has been performed. Thus, the Ni plating processing can be performed on only a required portion of the plurality of metal plates on which the slitting has been performed, and hence even when the production number of hermetic sealing lid members is small (in the case of small lot production), a reduction in yield can be suppressed.

A hermetic sealing lid member according to a second aspect of the present invention is a hermetic sealing lid member used for an electronic component housing package in which an electronic component is housed, and includes a base material layer comprised of a metal plate having a corrosion resistance and a Ni plated layer not formed on a side surface of the base material layer but formed on both or one of an upper surface and a lower surface of the base material layer. According to this structure, similarly to the hermetic sealing lid member formed by the method for manufacturing the hermetic sealing lid member according to the first aspect, even when the hermetic sealing lid member has portions on which no Ni plated layer is formed and the metal plate is exposed, corrosion of the hermetic sealing lid member can be effectively suppressed by the base material layer comprised of the metal plate having a corrosion resistance.

In the aforementioned hermetic sealing lid member according to the second aspect, the metal plate of which the base material layer is comprised is preferably made of an Fe alloy that contains at least Fe and 1 mass % or more of Cr. The Fe alloy more preferably contains 4 mass % or more of Cr. According to this structure, the metal plate having a sufficient corrosion resistance can be formed.

In this case, the Fe alloy preferably further contains Ni. The Fe alloy more preferably contains 40 mass % or more of Ni and 6 mass % or more of Cr. According to this structure, the corrosion resistance of the metal plate can be further improved by Ni. Furthermore, the Fe alloy further contains Ni such that the thermal expansion coefficient of the metal plate can be reduced by adjusting the content of Ni. Thus, even when the hermetic sealing lid member is bonded to a member made of ceramics generally having a smaller thermal expansion coefficient than that of a metal material, an increase in a difference in thermal expansion between the hermetic sealing lid member and the member can be suppressed. The content of Ni contained in the Fe alloy is preferably adjusted to 36 mass % or more and 47 mass % or less. Thus, disbonding between the hermetic sealing lid member and the member and occurrence of cracks on the hermetic sealing lid member and the member can be suppressed.

In the aforementioned structure in which the metal plate is made of the Fe alloy that further contains Ni, the Fe alloy preferably further contains Co. According to this structure, the thermal expansion coefficient of the metal plate can be effectively reduced by Co, and hence an increase in the difference in thermal expansion between the hermetic sealing lid member and the member can be effectively suppressed.

In the aforementioned hermetic sealing lid member according to the second aspect, a thickness of the Ni plated layer is preferably 1% or more and 12.5% or less of a thickness of the base material layer. The thickness of the Ni plated layer is more preferably 2.5% or more and 7.5% or less of the thickness of the base material layer. According to this structure, the thickness of the Ni plated layer is set to 1% (2.5%) or more of the thickness of the base material layer such that the hermetic sealing lid member can be melted with a sufficient welding strength while the corrosion resistance of the surface of the base material layer on which the Ni plated layer is formed can be further improved. Furthermore, the time required for forming the Ni plated layer can be reduced by setting the thickness of the Ni plated layer to 12.5% (7.5%) or less of the thickness of the base material layer, and hence the production efficiency of the hermetic sealing lid member can be improved.

A method for manufacturing an electronic component housing package according to a third aspect of the present invention includes forming a Ni plated metal plate by forming a Ni plated layer on a surface of a metal plate having a corrosion resistance, forming a hermetic sealing lid member by punching the Ni plated metal plate, and welding the hermetic sealing lid member to an electronic component housing member in which an electronic component is housed by melting the Ni plated layer of the hermetic sealing lid member. According to this structure, the hermetic sealing lid member, the corrosion of which is effectively suppressed, can be welded to the electronic component housing member through the Ni plated layer, and hence the hermetic sealability of the electronic component housing package using the hermetic sealing lid member can be maintained.

Effect of the Invention

According to the present invention, as hereinabove described, the method for manufacturing the hermetic sealing lid member that effectively suppresses corrosion of the hermetic sealing lid member even when the hermetic sealing lid member has the exposed portion on which no Ni plated layer is formed, the hermetic sealing lid member formed by the manufacturing method, and the method for manufacturing the electronic component housing package using the hermetic sealing lid member can be provided.

MODES FOR CARRYING OUT THE INVENTION

Embodiments embodying the present invention are hereinafter described on the basis of the drawings.

(First Embodiment)

The structure of a hermetic sealing lid member 1 according to a first embodiment of the present invention is now described with reference to FIGS. 1 and 2.

The hermetic sealing lid member 1 according to the first embodiment of the present invention is used for an electronic component housing package 100 (see FIG. 3) including an electronic component housing member 30 that houses a crystal unit 20 described later. The hermetic sealing lid member 1 is formed in a flat plate shape and has a length L of about 3.0 mm in a longitudinal direction (direction X), a width W1 of about 2.4 mm in a width direction (direction Y), and a thickness t1 of about 86 μm in a thickness direction (direction Z), as shown in FIG. 1.

Figure 1:
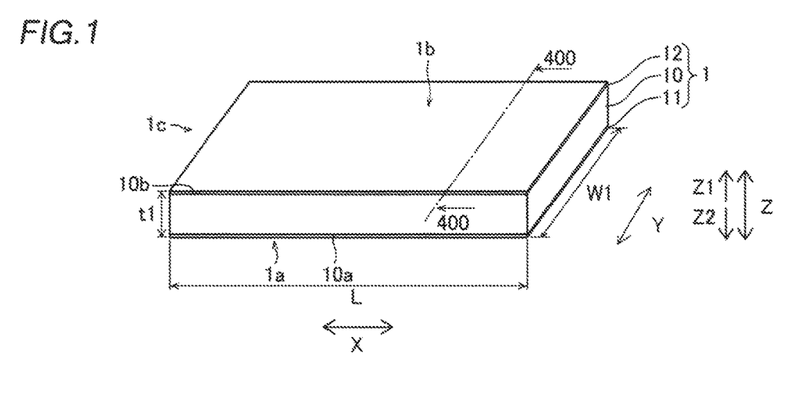
FIG. 1 A perspective view showing the structure of a hermetic sealing lid member according to a first embodiment of the present invention.
Figure 2:
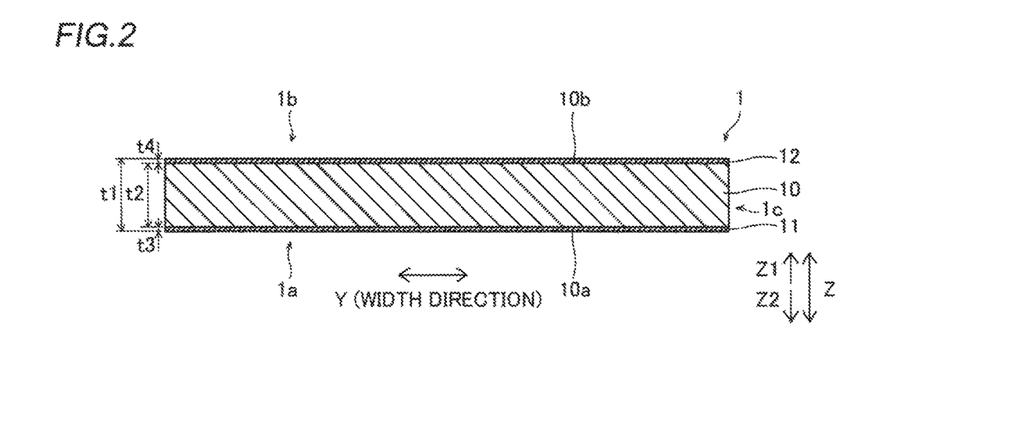
FIG. 2 A sectional view taken along the line 400-400 in FIG. 1.

According to the first embodiment, the hermetic sealing lid member 1 includes a base material layer 10 and Ni plated layers 11 and 12 formed on the lower surface 10a (the lower surface 1a side of the hermetic sealing lid member 1) and the upper surface 10b (the upper surface 1b side of the hermetic sealing lid member 1) of the base material layer 10, respectively, as shown in FIG. 2. On the other hand, no Ni plated layer is formed on the entire side surfaces 1c of the hermetic sealing lid member 1, as shown in FIG. 1.

The base material layer 10 is comprised of a metal plate of an Fe alloy that contains at least Fe and Cr. The content percentage of Cr in the Fe alloy of which the base material layer 10 is made is preferably about 1 mass % or more, and more preferably about 4 mass % or more. The content percentage of Cr in the Fe alloy of which the base material layer 10 is made is still more preferably about 6 mass % or more and about 18 mass % or less. Thus, the corrosion resistance of the base material layer 10 can be effectively ensured.

The Fe alloy of which the base material layer 10 is made preferably includes an Fe alloy that further contains Ni in addition to Fe and Cr. Thus, the corrosion resistance of the base material layer 10 can be further improved. As the Fe alloy that contains Fe, Cr, and Ni, a (36 to 47)Ni-(4 to 6)Cr—Fe alloy that contains 36 mass % or more and 47 mass % or less of Ni, 4 mass % or more and 6 mass % or less of Cr, inevitable impurities, and the balance Fe, an 8Ni-18Cr—Fe alloy that contains 8 mass % of Ni, 18 mass % of Cr, inevitable impurities, and the balance Fe, or the like can be used, for example. The content percentage of Ni is set to 36 mass % or more and 47 mass % or less such that the thermal expansion coefficient of the base material layer 10 can be effectively reduced. It is also preferable to use an Fe alloy that contains 40 mass % or more of Ni, 6 mass % or more of Cr, inevitable impurities, and the balance Fe.

The Fe alloy of which the base material layer 10 is made more preferably includes an Fe alloy that further contains Co in addition to Fe, Cr, and Ni. Thus, the thermal expansion coefficient of the base material layer 10 can be reduced while the corrosion resistance of the base material layer 10 is ensured. As the Fe alloy that contains Fe, Cr, Ni, and Co, a 29Ni-17Co-6Cr—Fe alloy that contains 29 mass % of Ni, 17 mass % of Co, 6 mass % of Cr, inevitable impurities, and the balance Fe or the like can be used, for example.

Figure 3:
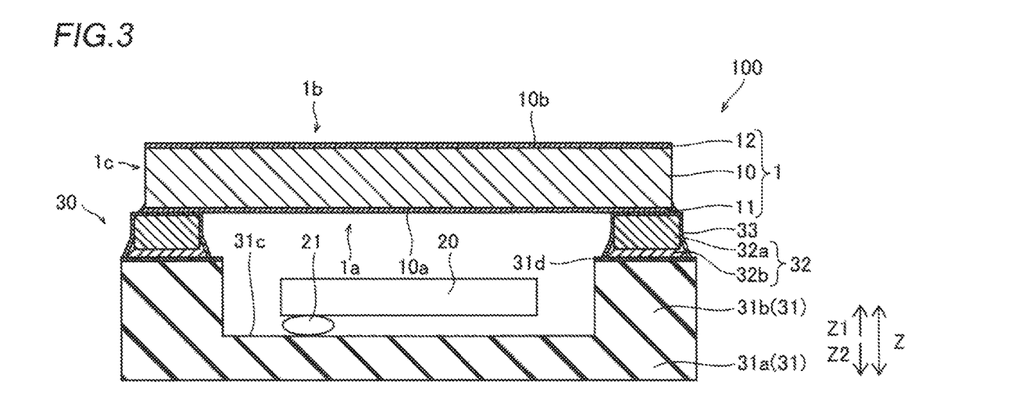
FIG. 3 A sectional view showing the structure of an electronic component housing package according to the first embodiment of the present invention.

The thermal expansion coefficient of the base material layer 10 is reduced such that the thermal expansion coefficient can be made closer to the thermal expansion coefficient of ceramics such as alumina ($Al_2O_3$), the thermal expansion coefficient of which is generally small. Thus, a difference in thermal expansion between the hermetic sealing lid member 1 including the base material layer 10 and a base 31, described later, of the electronic component housing member 30 made of the ceramics can be reduced, and hence occurrence of cracks and peeling in the electronic component housing package 100 can be suppressed.

The Ni plated layers 11 and 12 contain about 99 mass % or more of Ni (so-called pure Ni). These Ni plated layers 11 and 12 are formed by electrolytic Ni plating. The Ni plated layer 11 closer to the lower surface 1a functions as a bonding layer to be melted when the hermetic sealing lid member 1 is welded to the electronic component housing member 30 by seam welding, which is a type of resistance welding. The Ni plated layer 12 closer to the upper surface 1b has a function of reducing an electric resistance when welding is performed by seam welding.

The chromium of the Fe alloy of which the base material layer 10 is made is oxidized such that passive films (not shown) that mainly contain $Cr_2O_3$ are formed on portions of the side surfaces 1c of the hermetic sealing lid member 1 on which the base material layer 10 is exposed. Thus, the corrosion resistance of the base material layer 10 is improved.

The base material layer 10 has a thickness t2 of about 80 μm, and the Ni plated layers 11 and 12 each have a thickness t3 of about 3 μm. It is only required that the base material layer 10 have a thickness t2 of about 40 μm or more and about 80 μm or less. It is only required that the Ni plated layers 11 and 12 each have a thickness t3 of about 1 μm or more and about 10 μm or less, and the Ni plated layers 11 and 12 each preferably have a thickness t3 of about 2 μm or more and about 6 μm or less. In other words, it is only required that the thickness t3 of each of the Ni plated layers 11 and 12 be about 1% or more and about 12.5% or less of the thickness t2 of the base material layer 10, and the thickness t3 of each of the Ni plated layers 11 and 12 is preferably about 2.5% or more and about 7.5% or less of the thickness t2 of the base material layer 10.

The structure of the electronic component housing package 100 using the hermetic sealing lid member 1 according to the first embodiment of the present invention is now described with reference to FIG. 3.

The electronic component housing package 100 according to the first embodiment of the present invention includes the hermetic sealing lid member 1 and the electronic component housing member 30 hermetically sealed by the hermetic sealing lid member 1 in a state where the crystal unit 20 (see FIG. 4) is housed, as shown in FIG. 3. In the electronic component housing package 100, the hermetic sealing lid member 1 is arranged on the electronic component housing member 30 such that the Ni plated layer 11 closer to the lower surface 1a of the hermetic sealing lid member 1 is on the electronic component housing member 30 side (lower side, Z2 side). The crystal unit 20 is an example of an "electronic component" in the present invention.

The electronic component housing member 30 includes the box-shaped base 31 made of the alumina ($Al_2O_3$), which is ceramics, a ring-shaped seal ring 32 brazed/bonded to the base 31, and a protective plated layer 33 covering the seal ring 32.

The base 31 includes a bottom portion 31a on the Z2 side and a side portion 31b formed to extend upward (Z1 side) from the outer peripheral edge of the upper surface (the surface on the Z1 side) of the bottom portion 31a. A recess portion 31c is formed on the electronic component housing member 30, to be surrounded by the bottom portion 31a and the side portion 31b. The crystal unit 20 is housed in the recess portion 31c in a state fixed to the recess portion 31c with a bump 21.

A metalization layer 31d is formed on an upper end of the side portion 31b. This metalization layer 31d is formed in order to render brazing/bonding between the ceramics ($Al_2O_3$) of which the base 31 is made and an Fe alloy of which the seal ring 32 is made excellent.

The seal ring 32 made of metal includes a base material 32a made of a 29Ni-17Co—Fe alloy (so-called kovar (registered trademark)) and a silver solder portion 32b arranged on at least the lower surface of the base material 32a. Heat is applied in a state where the metalization layer 31d of the base 31 and the silver solder portion 32b of the seal ring 32 come into contact with each other such that the silver solder portion 32b is melted. Thus, the base 31 and the seal ring 32 are brazed/bonded to each other. In a state where the base 31 and the seal ring 32 are brazed/bonded to each other, the protective plated layer 33 including a Ni plated layer and a Au plated layer (not shown) is formed to cover the seal ring 32.

The hermetic sealing lid member 1 is welded by seam welding, which is a type of resistance welding, in a state arranged on the upper surface of the seal ring 32 of the electronic component housing member 30, to be bonded to the electronic component housing member 30. In other words, the Ni plated layer 11 of the hermetic sealing lid member 1 is melted by seam welding such that the hermetic sealing lid member 1 is bonded to the upper surface of the seal ring 32.

At this time, a portion of the silver solder portion 32b may reach the side surfaces 1c of the hermetic sealing lid member 1 and cover portions of the side surfaces 1c, but the side surfaces 1c of the hermetic sealing lid member 1 are generally exposed. The nickel contained in the Ni plated layers 11 and 12 has a corrosion resistance, and the base material layer 10 has a corrosion resistance such that corrosion of the side surfaces 1c of the hermetic sealing lid member 1 is suppressed.

A process for manufacturing the hermetic sealing lid member 1 and the electronic component housing package 100 according to the first embodiment of the present invention is now described with reference to FIGS. 1, 2, and 4 to 8.

Figure 4:
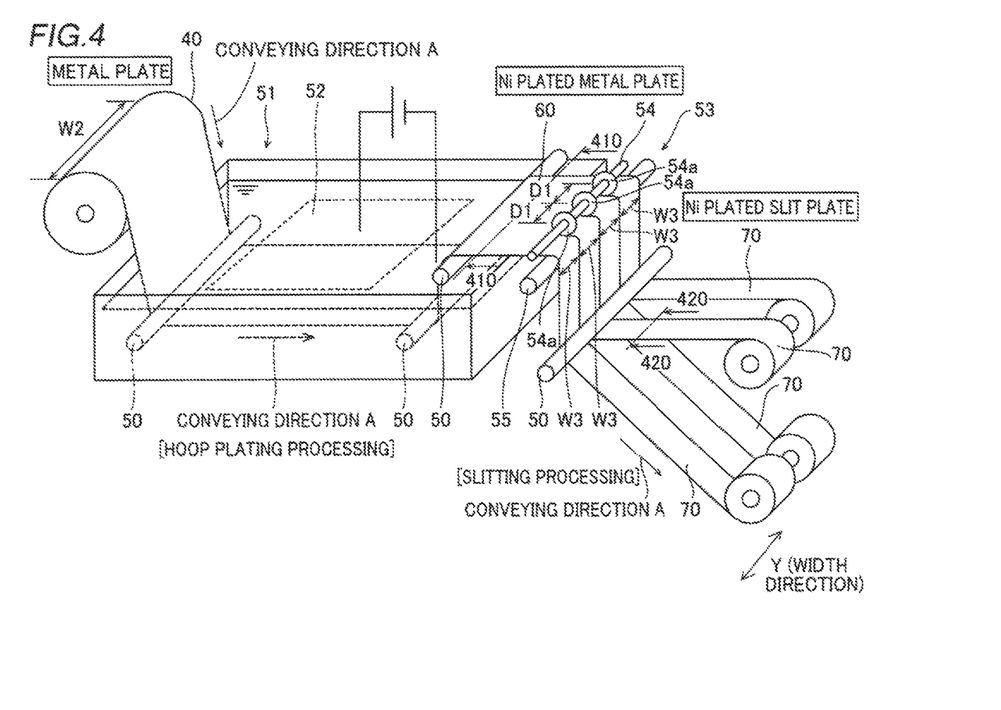
FIG. 4 A schematic diagram for illustrating hoop plating processing and slitting processing of a process for manufacturing the hermetic sealing lid member according to the first embodiment of the present invention.

First, a belt-like metal plate 40 that is made of the Fe alloy containing at least Fe and Cr and extends in the longitudinal direction (conveying direction A) perpendicular to the width direction (direction Y) is prepared, as shown in FIG. 4. This belt-like metal plate 40 is wound up in a coil shape. The belt-like metal plate 40 has a width W2 of about 12.4 mm in the width direction and a thickness t2 (see FIG. 5) of about 80 μm in the thickness direction (direction Z). Then, the belt-like metal plate 40 wound up in the coil shape is continuously sent out in the conveying direction A with a plurality of guide rollers 50.

In a manufacturing method according to the first embodiment, electrolytic Ni plating processing is performed by hoop plating processing on the belt-like metal plate 40 continuously sent out. This hoop plating processing is a plating method for continuously performing plating processing on a continuous body like the belt-like metal plate 40, unlike barrel plating processing.

Specifically, a Ni plating bath 51 that contains nickel sulfate, nickel chloride, boric acid, etc. is prepared. A pure Ni plate (electrolytic Ni plate) 52 that contains 99 mass % or more of Ni is arranged in the Ni plating bath 51. Then, a voltage is applied using the electrolytic Ni plate 52 as an anode and the belt-like metal plate 40 as a cathode while the belt-like metal plate 40 is conveyed in the conveying direction A. Thus, the nickel of the electrolytic Ni plate 52 loses electrons to be cationized and moves to the belt-like metal plate 40 in the Ni plating bath 51, and the cationized Ni ion receives electrons and deposits as Ni onto the surface (entire surface) of the belt-like metal plate 40. At this time, in the electrolytic Ni plating processing, the electrons are received directly from the belt-like metal plate 40, and hence the deposition efficiency of the nickel is high as compared with electroless plating processing such that a Ni plated layer 41 having a sufficient thickness t3 can be reliably formed.

Figure 5:
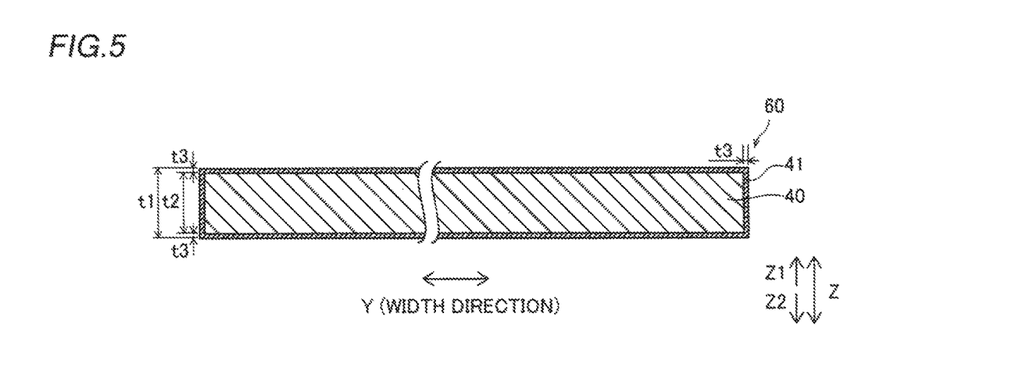
FIG. 5 A sectional view taken along the line 410-410 in FIG. 4.

Thus, the Ni plated layer 41 (see FIG. 5) is continuously formed on the entire surface of the belt-like metal plate 40, and a belt-like Ni plated plate 60 is continuously formed. At this time, the Ni plated layer 41 is continuously formed over all (entire surface) of the upper surface, lower surface, and side surfaces of the belt-like Ni plated plate 60, as shown in FIG. 5. The Ni plated layer 41 is formed substantially evenly over the entire surface of the belt-like metal plate 40 with a thickness t3 of about 3 μm. Consequently, the thickness t1 of the belt-like Ni plated plate 60 is about 86 μm. It is only required that the thickness t3 of the Ni plated layer 41 is about 1% or more and about 12.5% or less of the thickness t2 of the belt-like metal plate 40, and the thickness t3 of the Ni plated layer 41 is preferably about 2.5% or more and about 7.5% or less of the thickness t2 of the belt-like metal plate 40.

Then, the belt-like Ni plated plate 60 conveyed in the conveying direction A is continuously slit in a slitting portion 53. In other words, a slitting step is performed after a step of forming the belt-like Ni plated plate 60. Specifically, the slitting portion 53 includes a rotatable slit cutter portion 54 and a counter roller 55. The slit cutter portion 54 is provided with a plurality of (three) cutting portions 54a arranged at substantially equal intervals D1 of about 3.1 mm in the width direction (direction Y). The counter roller 55 is arranged opposite the slit cutter portion 54 with respect to the belt-like Ni plated plate 60.

When the belt-like Ni plated plate 60 passes through between the slit cutter portion 54 and the counter roller 55, the belt-like Ni plated plate 60 is continuously cut along the conveying direction A perpendicular to the width direction by the plurality of cutting portions 54a arranged at the substantially equal intervals D1. Thus, the belt-like Ni plated plate 60 is cut such that a plurality of (four) belt-like Ni plated slit plates 70 on which slitting has been performed is continuously formed. At this time, the width W3 of each of the belt-like Ni plated slit plates 70 is substantially equal (about 3.1 mm) to each of the intervals D1 between the plurality of cutting portions 54a. The belt-like Ni plated slit plates 70 are examples of a "Ni plated metal plate" in the present invention.

Figure 6:
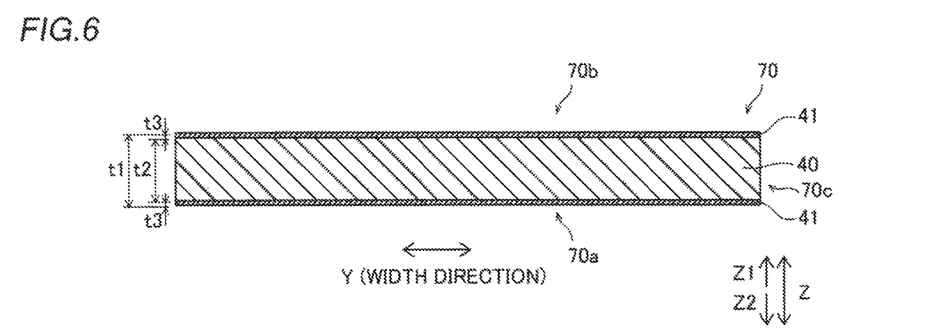
FIG. 6 A sectional view taken along the line 420-420 in FIG. 4.

In each of the belt-like Ni plated slit plates 70 obtained from other than both ends of the belt-like Ni plated plate 60 in the width direction, the Ni plated layer 41 is arranged on only the lower surface 70a and the upper surface 70b of the belt-like Ni plated slit plate 70 such that the metal plate 40 is exposed on the both side surfaces 70c of the belt-like Ni plated slit plate 70, as shown in FIG. 6. In each of the belt-like Ni plated slit plates 70 obtained from both ends of the belt-like Ni plated plate 60 in the width direction, the Ni plated layer 41 is formed on only the lower surface 70a and the upper surface 70b of the belt-like Ni plated slit plate 70 and one of the side surfaces 70c of the belt-like Ni plated slit plate 70 such that the metal plate 40 is exposed on the other of the side surfaces 70c of the belt-like Ni plated slit plate 70. Even in this state, the metal plate 40 has a corrosion resistance such that corrosion of exposed portions of the belt-like Ni plated slit plates 70 is suppressed. As shown in FIG. 4, each of the plurality of belt-like Ni plated slit plates 70 is wound up in a coil shape.

Figure 7:
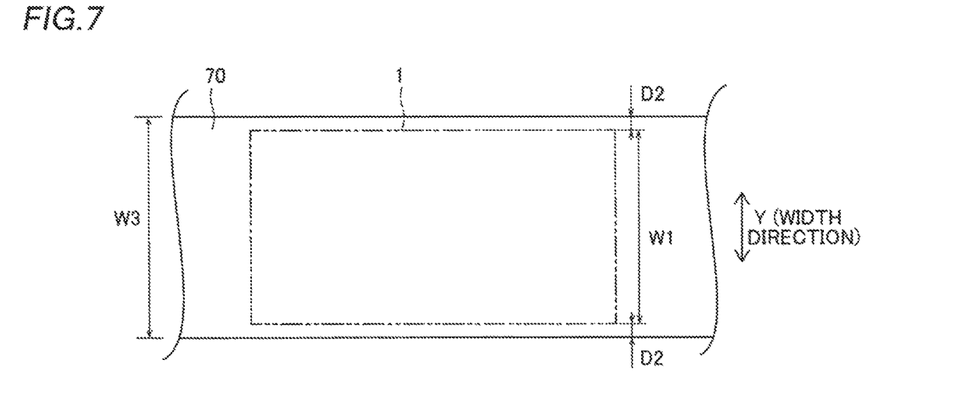
FIG. 7 A plan view of a Ni plated slit plate according to the first embodiment of the present invention as viewed from above.

In the manufacturing method according to the first embodiment, the belt-like Ni plated slit plate 70 is formed by the slitting such that the width W3 (about 3.1 mm) of the belt-like Ni plated slit plate 70 is larger by a predetermined machining allowance (2×D2 (about 0.7 mm)) than the width W1 (about 2.4 mm) of the hermetic sealing lid member 1, as shown in FIG. 7. It is preferable to make the predetermined machining allowance (2×D2) as small as possible since a larger number of hermetic sealing lid members 1 can be formed. On the other hand, it is preferable to make the predetermined machining allowance (2×D2) at least about twice (about 172 μm or more) the thickness t1 (about 86 μm; see FIGS. 2, 5, and 6) of the hermetic sealing lid member 1 (the Ni plated plate 60 and the Ni plated slit plate 70). Thus, the hermetic sealing lid member 1 can be reliably punched from the belt-like Ni plated slit plate 70.

Figure 8:
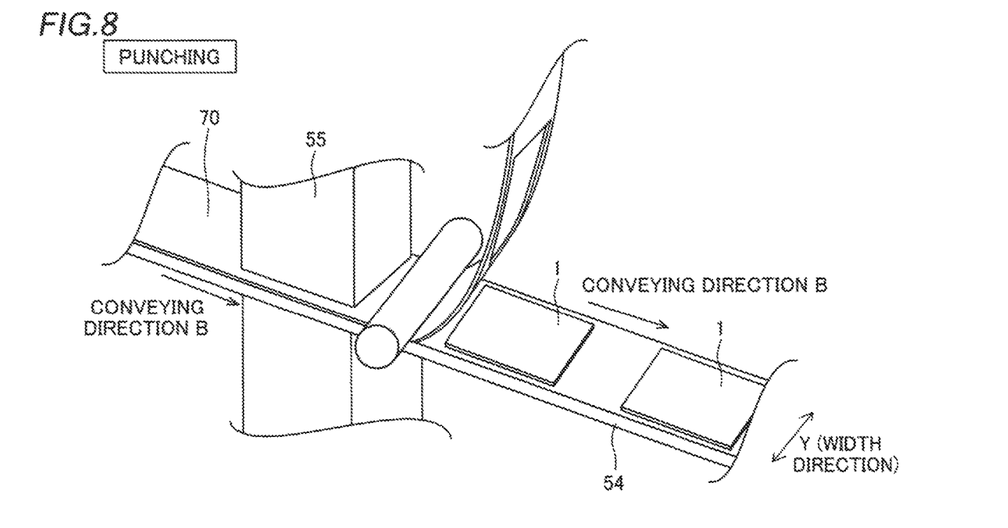
FIG. 8 A schematic diagram for illustrating punching processing of the process for manufacturing the hermetic sealing lid member according to the first embodiment of the present invention.

Then, punching is performed on the belt-like Ni plated slit plate 70 wound up in the coil shape while the belt-like Ni plated slit plate 70 is sent out in a conveying direction B, as shown in FIG. 8. In other words, the slitting step is performed before the punching. At this time, the hermetic sealing lid member 1 is punched at each regular interval from the belt-like Ni plated slit plate 70 while the belt-like Ni plated slit plate 70 is conveyed in the conveying direction B by a conveying device 54 such as a conveyor belt. At this time, the hermetic sealing lid member 1 is punched by a pressing machine 55 having a tip end mounted with a mold having a shape that corresponds to that of the hermetic sealing lid member 1 such that a substantially central portion of the belt-like Ni plated slit plate 70 in the width direction substantially matches the center of the hermetic sealing lid member 1. Consequently, the hermetic sealing lid member 1 is punched at a position inside by the interval D2 (about 0.35 mm) from each of both ends of the belt-like Ni plated slit plate 70 in the width direction, as shown in FIG. 7. It is preferable to punch the hermetic sealing lid member 1 at a position inside by the interval D2 of at least the thickness t1 of the hermetic sealing lid member 1 from each of both ends of the belt-like Ni plated slit plate 70 in the width direction.

Thus, the hermetic sealing lid member 1 including the base material layer 10 and the Ni plated layers 11 and 12 formed on the lower surface 10a (the lower surface 1a side of the hermetic sealing lid member 1) and the upper surface 10b (the upper surface 1b side of the hermetic sealing lid member 1) of the base material layer 10, respectively, and having the side surfaces 1c totally formed with no Ni plated layer, as shown in FIGS. 1 and 2, is continuously prepared.

The belt-like Ni plated slit plates 70 each may not be wound up in the coil shape and may be directly continuously punched.

Then, the base 31 (electronic component housing member 30) having the recess portion 31c to which the crystal unit 20 is fixed, to which the seal ring 32 is brazed/bonded, is prepared. Then, after the hermetic sealing lid member 1 is arranged on the upper surface of the seal ring 32, the Ni plated layer 11 of the hermetic sealing lid member 1 is melted by seam welding using an unshown roller electrode such that the hermetic sealing lid member 1 is welded to the electronic component housing member 30. Thus, the electronic component housing package 100 is prepared.

According to the first embodiment, the following effects can be obtained.

According to the first embodiment, as hereinabove described, the hermetic sealing lid member 1 is prepared by forming the Ni plated layer 41 over all (entire surface) of the upper surface, the lower surface, and the side surfaces of the belt-like metal plate 40 having a corrosion resistance before the punching to form the belt-like Ni plated plate 60 and punching the belt-like Ni plated slit plate 70. Thus, even when the Ni plated layer 41 (Ni plated layers 11 and 12) is not formed and the portions (side surfaces 10c (side surfaces 1c)) on which the metal plate 40 (base material layer 10) is exposed are formed, the metal plate 40 (base material layer 10) has a corrosion resistance, and hence progression of corrosion of the metal plate 40 (base material layer 10) from the portions on which the metal plate 40 (base material layer 10) is exposed can be effectively suppressed. Thus, the hermetic sealing lid member 1, the corrosion of which is effectively suppressed, can be obtained, and hence the hermetic sealability of the electronic component housing package 100 using the hermetic sealing lid member 1 can be maintained. Furthermore, the hermetic sealing lid member 1 is formed by forming the Ni plated layer 41 on the belt-like metal plate 40 to form the belt-like Ni plated metal plate 60 (belt-like Ni plated slit plate 70) and thereafter punching the belt-like Ni plated slit plate 70. Thus, the belt-like Ni plated metal plate 60 (belt-like Ni plated slit plate 70) can be continuously formed, and the hermetic sealing lid member 1 can be continuously prepared by the continuous punching. Thus, the production efficiency of the hermetic sealing lid member 1, the corrosion of which is effectively suppressed, can be improved.

According to the first embodiment, after the step of forming the belt-like Ni plated plate 60 and before a step of forming the hermetic sealing lid member 1, the belt-like Ni plated plate 60 is slit such that the belt-like Ni plated plate 60 can be easily cut to the width W3 that corresponds to the size of the hermetic sealing lid member 1 by the slitting.

According to the first embodiment, the width W3 of the belt-like Ni plated slit plate 70 is made larger by the predetermined machining allowance (2×D2) of at least about twice the thickness t1 of the hermetic sealing lid member 1 than the width W1 of the hermetic sealing lid member 1 by the slitting. According to this structure, an excessive reduction in the machining allowance of the belt-like Ni plated slit plate 70 can be suppressed, and hence occurrence of torsion and warpage in the belt-like Ni plated slit plate 70 at the time of punching can be suppressed. Thus, occurrence of a burr in a punched portion of the hermetic sealing lid member 1 at the time of punching can be suppressed, and an increase in the warpage of the hermetic sealing lid member 1 after the punching can be suppressed.

According to the first embodiment, the Ni plated layer 41 is formed over all (entire surface) of the upper surface, the lower surface, and the side surfaces of the belt-like metal plate 40 by the electrolytic Ni plating processing such that the Ni plated layer 41 having a sufficient thickness can be reliably formed as compared with electroless Ni plating processing, and hence generation of regions on which the Ni plated layer 41 is insufficiently formed can be effectively suppressed. Thus, the hermetic sealing lid member 1, the corrosion of which is effectively suppressed, can be obtained. Furthermore, even when the Ni plated layer 41 is continuously formed on a surface of the belt-like metal plate 40, the Ni plated layer 41 having a sufficient thickness can be reliably formed. In addition, as compared with the electroless Ni plating processing, the Ni plated layer 41 containing Ni of high purity and having lower impurities can be formed.

According to the first embodiment, the hermetic sealing lid member 1 including the base material layer 10 and the Ni plated layers 11 and 12 formed on the lower surface 10a (the lower surface 1a side of the hermetic sealing lid member 1) and the upper surface 10b (the upper surface 1b side of the hermetic sealing lid member 1) of the base material layer 10, respectively, and having the side surfaces 1c totally formed with no Ni plated layer is formed by punching the belt-like Ni plated slit plate 70. In even this hermetic sealing lid member 1 in which the side surfaces 1c thereof are formed with no Ni plated layer 41 such that the portions on which the base material layer 10 (metal plate) is exposed are generated, the base material layer 10 has a corrosion resistance, and hence progression of corrosion of the base material layer 10 from the side surfaces 1c can be effectively suppressed. Thus, the hermetic sealing lid member 1, the corrosion of which is effectively suppressed, can be obtained.

According to the first embodiment, the thickness t3 of the Ni plated layer 41 is made about 1% or more (more preferably about 2.5% or more) of the thickness t2 of the belt-like metal plate 40 such that the thickness t3 of each of the Ni plated layers 11 and 12 is made about 1% or more (more preferably about 2.5% or more) of the thickness t2 of the base material layer 10. According to this structure, the thickness t3 of each of the Ni plated layers 11 and 12 can be sufficiently ensured, and hence the hermetic sealing lid member 1 can be melted to the electronic component housing member 30 with a sufficient welding strength when the hermetic sealing lid member 1 is welded to the electronic component housing member 30 by melting the Ni plated layer 11 while the corrosion resistance of the surfaces 10a and 10b (the surface of the belt-like metal plate 40) of the base material layer 10 can be further improved.

According to the first embodiment, the thickness t3 of the Ni plated layer 41 is made about 12.5% or less (more preferably 7.5% or less) of the thickness t2 of the belt-like metal plate 40 such that the thickness t3 of each of the Ni plated layers 11 and 12 is made about 12.5% or more (more preferably 7.5% or less) of the thickness t2 of the base material layer 10. According to this structure, the time required for a step of forming the Ni plated layer 41 can be reduced, and hence the production efficiency of the hermetic sealing lid member 1 can be improved.

According to the first embodiment, the slitting step is performed after the step of forming the Ni plated metal plate 60 and before the step of forming the hermetic sealing lid member 1. Thus, the slitting is performed after the Ni plated layer 41 is formed on the metal plate 40 such that a plurality of Ni plated metal plates 60 can be easily formed. Furthermore, the Ni plated layer 41 is not formed on the side surfaces of each of the belt-like Ni plated slit plates 70 after the slitting, and hence the amount of Ni plating used (the amount of the Ni plating bath 51 used) can be reduced as compared with the case where the slitting is performed before the step of forming the Ni plated metal plate.

According to the first embodiment, the belt-like metal plate 40 having a corrosion resistance, of which the base material layer 10 is comprised, is made of the Fe alloy that contains 1 mass % or more (more preferably 4 mass % or more) of at least Cr and Fe such that the metal plate 40 (base material layer 10) having a sufficient corrosion resistance can be formed.

According to the first embodiment, the belt-like metal plate 40 and the base material layer 10 are made of the Fe alloy (more preferably the Fe alloy that contains 40 mass % or more of Ni and 6 mass % or more of Cr) that further contains Ni in addition to Fe and Cr such that the corrosion resistance of the belt-like metal plate 40 can be further improved by Ni. Furthermore, the thermal expansion coefficient of the belt-like metal plate 40 can be reduced by adjusting the content of Ni to 36 mass % or more and 47 mass % or less. Thus, even when the hermetic sealing lid member 1 is bonded to the base 31 made of the ceramics, an increase in the difference in thermal expansion between the hermetic sealing lid member 1 and the base 31 can be suppressed. Thus, disbonding between the hermetic sealing lid member 1 and the base 31 and occurrence of cracks on the hermetic sealing lid member 1 and the base 31 can be suppressed. Furthermore, the belt-like metal plate 40 and the base material layer 10 are made of the Fe alloy that further contains Co such that the thermal expansion coefficient of the belt-like metal plate 40 can be effectively reduced by Co, and hence an increase in the difference in thermal expansion between the hermetic sealing lid member 1 and the base 31 can be effectively suppressed.

(Second Embodiment)

A process for manufacturing a hermetic sealing lid member 1 according to a second embodiment of the present invention is now described with reference to FIGS. 1, 2, and 9 to 11. A method for manufacturing the hermetic sealing lid member 1 according to this second embodiment is different from the method for manufacturing the hermetic sealing lid member 1 according to the first embodiment, and an example of performing slitting processing before hoop plating processing is described. The structure of the hermetic sealing lid member 1 itself is similar to that according to the aforementioned first embodiment, and hence the description is omitted.

Figure 9:
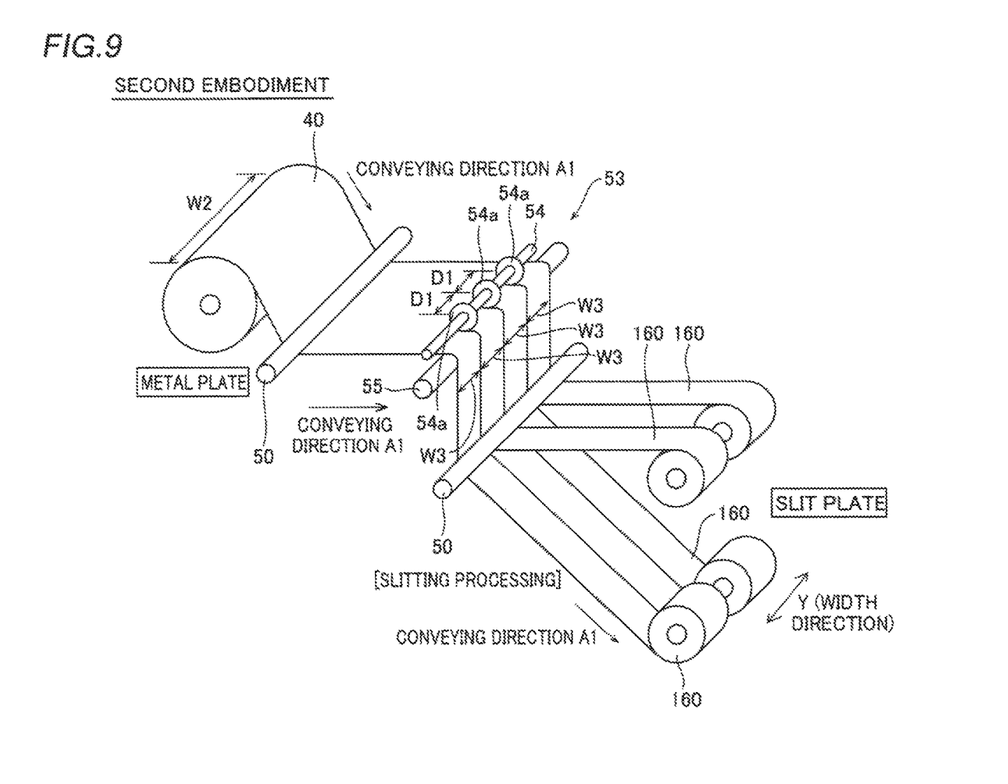
FIG. 9 A schematic diagram for illustrating slitting processing of a process for manufacturing a hermetic sealing lid member according to a second embodiment of the present invention.

First, similarly to the first embodiment, a belt-like metal plate 40 made of an Fe alloy that contains at least Fe and Cr is prepared, as shown in FIG. 9. Then, the belt-like metal plate 40 wound up in a coil shape is continuously sent out in a conveying direction A1 with a plurality of guide rollers 50.

In the manufacturing method according to the second embodiment, the belt-like metal plate 40 continuously sent out is continuously slit in a slitting portion 53, similarly to the slitting to the Ni plated plate 60 according to the first embodiment. Thus, the belt-like metal plate 40 is cut into a plurality of (four) belt-like slit plates 160. The width W3 of each of the four belt-like slit plates 160 is substantially equal (about 3.1 mm) to each of intervals D1 between a plurality of cutting portions 54a. Then, each of the plurality of belt-like slit plates 160 are wound up in a coil shape.

Figure 10:
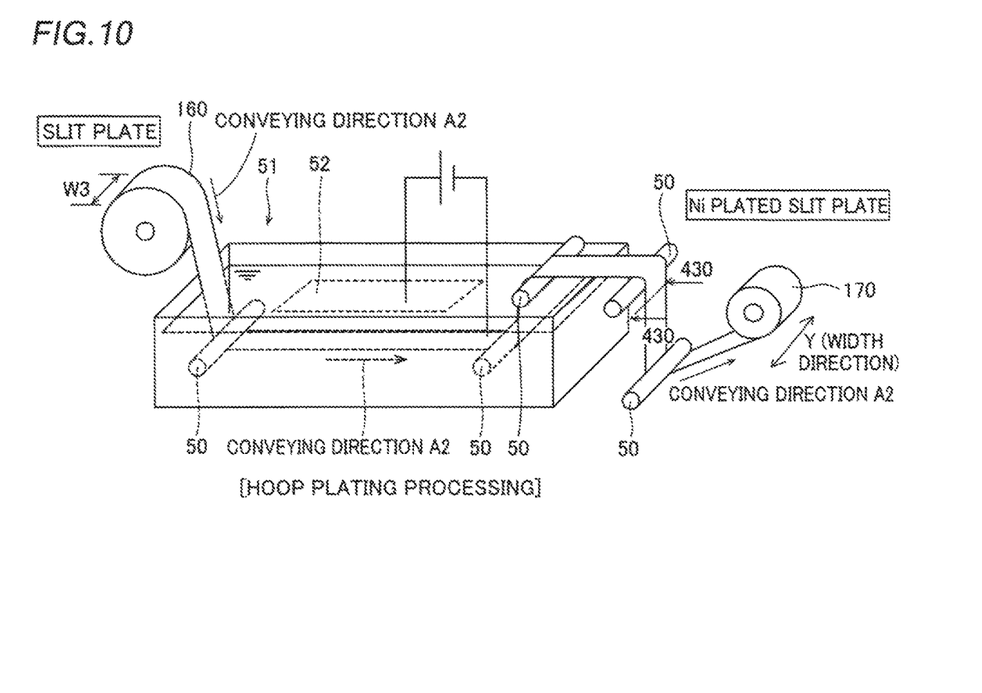
FIG. 10 A schematic diagram for illustrating hoop plating processing of the process for manufacturing the hermetic sealing lid member according to the second embodiment of the present invention.
Figure 11:
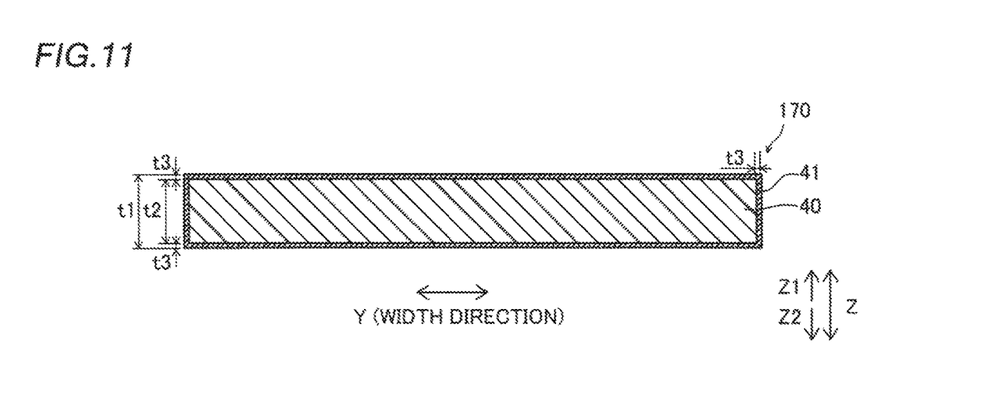
FIG. 11 A sectional view taken along the line 430-430 in FIG. 10.

Then, electrolytic Ni plating processing by the hoop plating processing is performed on each of the belt-like slit plates 160 wound up in the coil shape while the belt-like slit plates 160 is sent out in the conveying direction A2, as shown in FIG. 10. This electrolytic Ni plating processing by the hoop plating processing is similar to the electrolytic Ni plating processing by the hoop plating processing on the belt-like metal plate 40 according to the first embodiment. Thus, a Ni plated layer 41 (see FIG. 11) is continuously formed on the entire belt-like slit plates 160, and belt-like Ni plated slit plates 170 are continuously formed. In other words, a slitting step is performed before a step of forming the Ni plated slit plates 170. The belt-like Ni plated slit plates 170 is examples of a "Ni plated metal plate" in the present invention.

Unlike the belt-like Ni plated slit plates 70 according to the aforementioned first embodiment, the Ni plated layer 41 is continuously formed over all (entire surface) of the upper surfaces, the lower surfaces, and the side surfaces of the belt-like Ni plated slit plates 170. The Ni plated layer 41 is formed substantially evenly over the entire surfaces of the belt-like slit plates 160 with a thickness t3. Then, punching is performed on the belt-like Ni plated slit plates 170 such that the hermetic sealing lid member 1 shown in FIGS. 1 and 2 is formed. The punching is similar to that in the manufacturing method according to the aforementioned first embodiment, and hence the description is omitted.

The belt-like slit plates 160 each may not be wound up in the coil shape, and the electrolytic Ni plating processing by the hoop plating processing may be directly performed on the belt-like slit plates 160.

According to the second embodiment, the following effects can be obtained.

According to the second embodiment, as hereinabove described, the hermetic sealing lid member 1 is formed by forming the Ni plated layer 41 over all (entire surface) of the upper surfaces, the lower surfaces, and the side surfaces of the belt-like slit plates 160 having a corrosion resistance before the punching to form the belt-like Ni plated slit plates 170 and punching the belt-like Ni plated slit plates 170. Thus, the hermetic sealing lid member 1, the corrosion of which is effectively suppressed, can be obtained similarly to the aforementioned first embodiment.

According to the second embodiment, the belt-like metal plate 40 is slit before the step of forming the belt-like Ni plated slit plates 170. Thus, the belt-like metal plate 40 can be easily cut to the width W3 that corresponds to the size of the hermetic sealing lid member 1 by the slitting. Furthermore, Ni plating processing can be performed on only a portion of the plurality of belt-like slit plates 160 on which the slitting has been performed. Thus, when the belt-like metal plate 40 is not entirely formed to the belt-like Ni plated slit plates 170 and is partially used for another purpose, for example, the slitting is performed before the Ni plating processing, and hence the Ni plating processing can be performed on only a portion of the belt-like slit plates 160 on which the slitting has been performed, required as the belt-like Ni plated slit plates 170. Consequently, even when the production number of hermetic sealing lid members 1 is small (in the case of small lot production), a reduction in yield can be suppressed.

EXAMPLE

A study of a base material layer used for a hermetic sealing lid member, conducted in order to confirm the effects of the aforementioned embodiments is now described with reference to FIGS. 2, 12, and 13.

Six types of Ni—Cr—Fe alloy having different content percentages of Ni and Cr from each other and one type of Ni—Co—Cr—Fe alloy, and one type of Ni—Cr alloy were used as metal having a corrosion resistance, of which the base material layer 10 (see FIG. 2) of the hermetic sealing lid member 1 is made.

As the Ni—Cr—Fe alloys, a 36Ni-6Cr—Fe alloy that contains 36 mass % of Ni, 6 mass % of Cr, inevitable impurities, and the balance Fe, a 38Ni-6Cr—Fe alloy that contains 38 mass % of Ni, a 40Ni-6Cr—Fe alloy that contains 40 mass % of Ni, a 42Ni-4Cr—Fe alloy that contains 42 mass % of Ni and 4 mass % of Cr, a 42Ni-6Cr—Fe alloy that contains 42 mass % of Ni, and a 47Ni-6Cr—Fe alloy that contains 47 mass % of Ni were used.

As the Ni—CO—Cr—Fe alloy, a 29Ni-17Co-6Cr—Fe alloy was used. As the Ni—Cr alloy, an 18Cr—Fe alloy (so-called SUS430) that contains 18 mass % of Cr, inevitable impurities, and the balance Fe was used.

On the other hand, as a test material (comparative example) having no corrosion resistance, a Ni—Co—Fe alloy that contains no Cr was used. Specifically, a 29Ni-17Co—Fe alloy (co-called kovar (registered trademark)) that contains 29 mass % of Ni, 17 mass % of Co, inevitable impurities, and the balance Fe was used.

(Study of Base Material Layer Based on Corrosion Resistance)

First, as a corrosion resistance test, a salt spray test was conducted on each of test materials having different compositions from each other for at least 48 hours at a temperature of 35±2° C., a salt concentration of 5±1 mass %, and a pH of 6.5 or more and 7.2 or less according to JIS C60068-2-11. The degree of corrosion of each of the test materials was observed. The corrosion resistance was evaluated after a lapse of 24 hours and after a lapse of 48 hours. The corrosion resistance of a test material of a 42Ni-4Cr—Fe alloy after a lapse of 72 hours was also evaluated. The corrosion resistance of a test material of a 42Ni-6Cr—Fe alloy after a lapse of 72 hours and after a lapse of 144 hours was also evaluated. At this time, as evaluations of the corrosion resistance, x marks (cross marks) were put on test materials on which significant corrosion was confirmed. On the other hand, Δ marks (triangle mark) were put on test materials on which slight corrosion was confirmed but did not cause a practical problem, and ○ marks (circle marks) were put on test materials on which no corrosion was confirmable. Referring to the results, ☆ marks (star marks) were put on materials for the base material layer that were evaluated to be particularly suitable in practice, ⊚ marks (double circle marks) were put on materials for the base material layer that were evaluated to be preferable in practice, ○ marks (double circle marks) were put on materials for the base material layer that were evaluated to be usable in practice, and x marks (cross marks) were put on materials for the base material layer that were evaluated to be unsuitable in practice.

Figure 12:
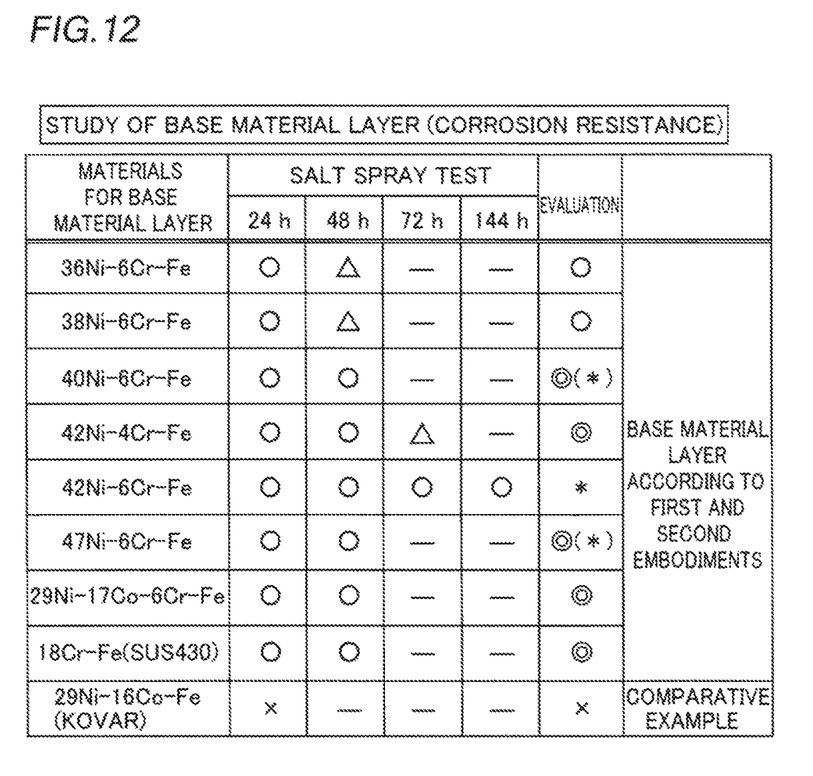
FIG. 12 A table showing the results of a salt spray test.

The results of the salt spray test were that on any of the Fe alloys that contain Cr, corrosion was hardly confirmed after a lapse of 24 hours, as shown in FIG. 12. On the other hand, on the Fe alloy (29Ni-17Co—Fe alloy) according to the comparative example that contains no Cr, significant corrosion was confirmed after a lapse of 24 hours. From these, the Fe alloys that contain Cr could be confirmed to have a corrosion resistance.

On the 36Ni-6Cr—Fe alloy and the 38Ni-6Cr—Fe alloy, corrosion was confirmed after a lapse of 48 hours. Thus, it has been proved that of the content percentages of Fe and Ni of the Fe alloy of which the base material layer is made, the content percentage of Ni is increased such that the corrosion of the Fe alloy can be more reliably suppressed, and the corrosion resistance is improved.

On the 42Ni-4Cr—Fe alloy, slight corrosion was confirmed after a lapse of 72 hours. On the other hand, on the 42Ni-6Cr—Fe alloy, corrosion was hardly confirmed even after a lapse of 144 hours. Thus, it has been proved that the content of Cr of the Fe alloy of which the base material layer is made is set to 6 mass % or more such that the corrosion can be still more reliably suppressed, and the corrosion resistance is improved. Therefore, an Fe alloy in which the content of Cr is 6 mass % or more and the content of Ni is 40 mass % or more is conceivably particularly suitable as the Fe alloy of which the base material layer is made. Although no salt spray test for at least 48 hours is conducted on the 40Ni-6Cr—Fe alloy and the 47Ni-6Cr—Fe alloy, the 40Ni-6Cr—Fe alloy and the 47Ni-6Cr—Fe alloy each conceivably have a corrosion resistance capable of sufficiently suppressing corrosion for a long time exceeding 48 hours.

(Study of Base Material Layer Based on Thermal Expansibility)

Next, metal suitable for the base material layer according to the present invention was studied based on the average thermal expansion coefficients of the above test materials. An Fe alloy having a thermal expansion coefficient close to the thermal expansion coefficient of ceramics such as alumina ($Al_2O_3$) of which an object to be welded (base 31) in sealing is made is conceivably more suitable as a material for the base material layer.

Specifically, an average thermal expansion coefficient in a temperature range of 30° C. to 300° C., an average thermal expansion coefficient in a temperature range of 30° C. to 400° C., and an average thermal expansion coefficient in a temperature range of 30° C. to 500° C. were obtained for each of the test materials. For the alumina of a reference example, only an average thermal expansion coefficient in a temperature range of 30° C. to 400° C. was obtained.

Figure 13:
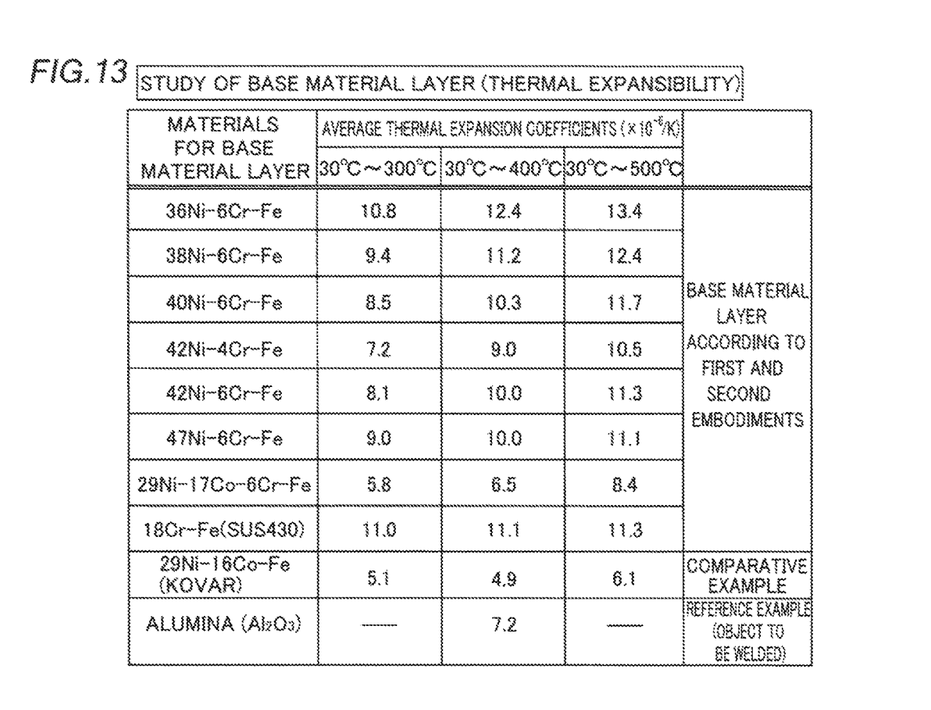
FIG. 13 A table showing average thermal expansion coefficients.

It has been proved from the average thermal expansion coefficients shown in FIG. 13 that the thermal expansion coefficient of the Ni—Co—Cr—Fe alloy (29Ni-17Co-6Cr—Fe alloy) that contains Co is larger than the thermal expansion coefficient of the 29Ni-17Co—Fe alloy that contains no Cr, but is smaller than the thermal expansion coefficients of the Ni—Cr—Fe alloys and the Ni—Cr alloy in all the temperature ranges. The thermal expansion coefficient of the Ni—Co—Cr—Fe alloy became a thermal expansion coefficient closest to the thermal expansion coefficient of the alumina. It has been proved from these that the Ni—Co—Cr—Fe alloy is most preferable as low thermal expansion metal of which the base material layer 10 of the hermetic sealing lid member 1 is comprised in terms of thermal expansibility.

The average thermal expansion coefficients of the Ni—Cr—Fe alloys were increased in the temperature range of 30° C. to 500° C., but were reduced in the temperature range of 30° C. to 300° C. Consequently, it has been proved that the Ni—Cr—Fe alloys are also preferable as materials for the base material layer 10 of the hermetic sealing lid member 1 mainly arranged in a low temperature environment of about 300° C. or less. It has been proved that when the content percentages of Ni contained in the Ni—Cr—Fe alloys are 40 mass % or more and 47 mass % or less, the thermal expansion coefficients can be further reduced such that the Ni—Cr—Fe alloys that contain 40 mass % or more and 47 mass % or less of Ni are more preferable, and when the content percentages of Ni are in the vicinity of 42 mass %, the thermal expansion coefficients can be still further reduced such that the Ni—Cr—Fe alloys that contain about 42 mass % of Ni are still more preferable. Furthermore, when the content percentages of Cr contained in the Ni—Cr—Fe alloys are less than 6 mass %, the thermal expansion coefficients can be further reduced such that the Ni—Cr—Fe alloys that contain less than 6 mass % of Cr are more preferable.

The thermal expansion coefficient of the Cr—Fe alloy (18Cr—Fe alloy) was increased to some extent in all the temperature ranges, but variations in thermal expansion coefficient caused by temperature changes were small. Particularly in the temperature range of 30° C. to 500° C., the thermal expansion coefficient of the Cr—Fe alloy was smaller than those of the (36 to 40 and 47)Ni-6Cr—Fe alloys. From this, it has been proved that the Cr—Fe alloy is also preferable as a material for the base material layer 10 of the hermetic sealing lid member 1 arranged particularly in a high temperature environment of about 400° C.

The embodiments and Example disclosed this time must be considered as illustrative in all points and not restrictive. The range of the present invention is shown not by the above description of the embodiments and Example but by the scope of claims for patent, and all modifications within the meaning and range equivalent to the scope of claims for patent are further included.

Figure 14:
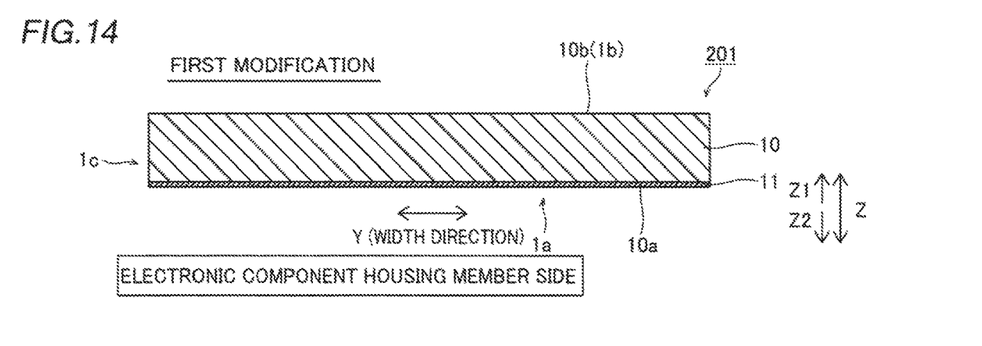
FIG. 14 A sectional view showing the structure of a hermetic sealing lid member according to a first modification of the first and second embodiments of the present invention.

For example, while the example in the hermetic sealing lid member 1 includes the base material layer 10 and the Ni plated layers 11 and 12 formed on the lower surface 10a and the upper surface 10b of the base material layer 10, respectively, has been shown in each of the aforementioned first and second embodiments, the present invention is not restricted to this. According to the present invention, as in a first modification of the first and second embodiments shown in FIG. 14, a hermetic sealing lid member 201 may include only a base material layer 10 and a Ni plated layer 11 formed on the lower surface 10a (a lower surface 1a side on an electronic component housing member side (Z2 side)) of the base material layer 10 and may not include a Ni plated layer formed on the upper surface 10b of the base material layer 10. This hermetic sealing lid member 201 can be formed by performing electrolytic Ni plating processing by hoop plating processing in a state where an unshown mask is formed on the upper surface of a belt-like metal plate or a belt-like slit plate, and thereafter removing the mask and performing punching.

Figure 15:
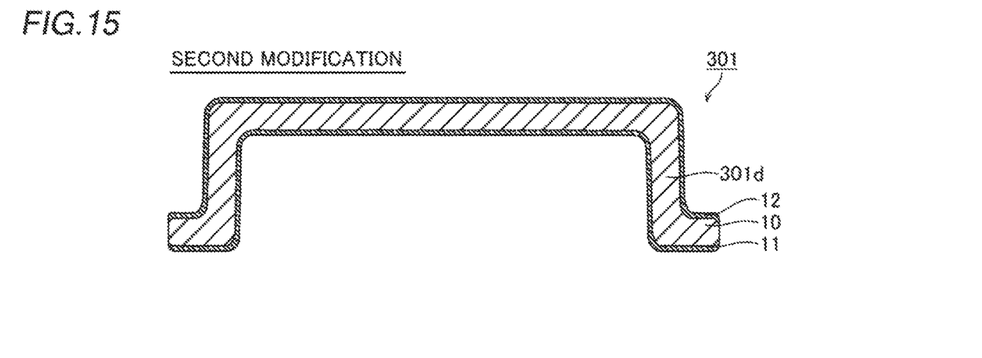
FIG. 15 A sectional view showing the structure of a hermetic sealing lid member according to a second modification of the first and second embodiments of the present invention.

While the example of forming the hermetic sealing lid member 1 in the flat plate shape has been shown in each of the aforementioned first and second embodiments, the present invention is not restricted to this. For example, as in a second modification of the first and second embodiments shown in FIG. 15, a hermetic sealing lid member 301 may be formed in a box shape by providing, in the hermetic sealing lid member 301, a wall 301d that protrudes downward (Z2 side) from the entire circumference of a side edge. As shown in FIG. 15, a lower end of the wall 301d is preferably formed in a flange shape.

While the example of slitting the belt-like Ni plated plate 60 into the four belt-like Ni plated slit plates 70 by the slitting portion 53 has been shown in the aforementioned first embodiment, and the example of slitting the belt-like metal plate 40 into the four belt-like slit plates 160 by the slitting portion 53 has been shown in the aforementioned second embodiment, the present invention is not restricted to this. The present invention is not restricted to a case where a belt-like plate member is slit into four belt-like slit plates. In other words, the belt-like plate member may be slit into two, three, or five or more belt-like slit plates. A belt-like metal plate having a width of about 50 mm may be slit into sixteen slit plates, for example. In this case, the width of each of the slit plates is about 3.1 mm.

While the example of continuously punching one hermetic sealing lid member 1 from the belt-like Ni plated slit plate 70 has been shown in the aforementioned first embodiment, the present invention is not restricted to this. According to the present invention, a plurality of hermetic sealing lid members may be punched at a time by using a mold having a shape that allows the plurality of hermetic sealing lid members to be punched at a time. When the plurality of (three, for example) hermetic sealing lid members is punched in the width direction of the belt-like Ni plated slit plate, it is necessary to make the width of the belt-like Ni plated slit plate multiple times (three times) the total of the width (W1) of each of the hermetic sealing lid members and a predetermined machining allowance (2×D2) (3×(W1+(2×D2))).

Furthermore, the widths of the slit plates on which slitting have been performed may be varied individually. Thus, when the Ni plated plate is slit as in the first embodiment, the Ni plated slit plates that correspond to the widths of the plurality of hermetic sealing lid members, respectively, can be formed at a time. When the metal plate is slit as in the second embodiment, the slit plates that correspond to the widths of the plurality of hermetic sealing lid members, respectively, can be formed, and no Ni plated layer is formed such that the slit plates can be used for other than the hermetic sealing lid members.

While the example in which the Ni plated layers 11 and 12 are made of 99 mass % or more of pure Ni has been shown in each of the aforementioned first and second embodiments, the present invention is not restricted to this. According to the present invention, the Ni plated layers may be made of Ni having a lower purity. Alternatively, the Ni plated layers may be made of a Ni alloy. For example, electroless plating processing may be performed on the belt-like metal plate such that the Ni plated layers may be made of a Ni alloy.

While the example in which the hermetic sealing lid member 1 and the electronic component housing member 30 are bonded to each other by seam welding, which is a type of resistance welding, has been shown in the aforementioned first embodiment, the present invention is not restricted to this. For example, the hermetic sealing lid member and the electronic component housing member may be bonded to each other by resistance spot welding, which is a type of resistance welding. Alternatively, the hermetic sealing lid member and the electronic component housing member may be bonded to each other by a bonding method other than resistance welding. For example, the hermetic sealing lid member and the electronic component housing member may be bonded to each other by electron beam welding using an electron beam.

While the example of housing the crystal unit 20 in the electronic component housing member 30 has been shown in the aforementioned first embodiment, the present invention is not restricted to this. For example, a SAW filter (surface acoustic wave filter) or the like may be housed in the electronic component housing member.

While the example of forming the belt-like Ni plated plate 60 by forming the Ni plated layer 41 on the belt-like metal plate 40 has been shown in the aforementioned first embodiment, and the example of forming the belt-like Ni plated slit plates 170 by forming the Ni plated layer 41 on each of the belt-like slit plates 160 has been shown in the aforementioned second embodiment, the present invention is not restricted to this. According to the present invention, the Ni plated layer may be formed on a non-belt-like metal plate or the slit plates, which are cut in a predetermined size, such that a non-belt-like Ni plated plate or Ni plated slit plates may be formed.

DESCRIPTION OF REFERENCE NUMERALS 1, 201, 301: hermetic sealing lid member
1a: lower surface (of hermetic sealing lid member)
1b: upper surface (of hermetic sealing lid member)
1c: side surface (of hermetic sealing lid member)
10: base material layer
10a: lower surface (of base material layer)
10b: upper surface (of base material layer)
10c: side surface (of base material layer)
11, 12, 41: Ni plated layer
20: crystal unit (electronic component)
40: metal plate
60: Ni plated metal plate
70, 170: Ni plated slit plate (Ni plated metal plate)
100: electronic component housing package
160: slit plate (a plurality of metal plates)

The invention claimed is:

1. A method for manufacturing a hermetic sealing lid member used for an electronic component housing package in which an electronic component is housed, comprising:
forming a Ni plated metal plate by forming a Ni plated layer on a surface of a metal plate made of an alloy having a corrosion resistance comprising Fe and 1 mass % or more of Cr; and
forming the hermetic sealing lid member by punching the Ni plated metal plate.

2. The method for manufacturing the hermetic sealing lid member according to claim 1, further comprising slitting in which the metal plate or the Ni plated metal plate is cut into a plurality of the metal plates or a plurality of the Ni plated metal plates.

3. The method for manufacturing the hermetic sealing lid member according to claim 2, wherein
the slitting includes slitting the metal plate or the Ni plated metal plate such that the metal plate or the Ni plated metal plate on which the slitting has been performed has a width larger by a machining allowance of at least twice a thickness of the hermetic sealing lid member than a width of the hermetic sealing lid member.

4. The method for manufacturing the hermetic sealing lid member according to claim 1, wherein
the forming of the Ni plated metal plate includes forming the Ni plated layer on the surface of the metal plate by electrolytic Ni plating processing.

5. The method for manufacturing the hermetic sealing lid member according to claim 1, wherein
the forming of the Ni plated metal plate includes forming the Ni plated layer on both or one of an upper surface -and a lower surface -of the metal plate having the corrosion resistance, and
the forming of the hermetic sealing lid member by the punching includes forming, by the punching of the Ni plated metal plate, the hermetic sealing lid member in which the Ni plated layer is not formed on a side surface -of the hermetic sealing lid member but is formed on both or one of an upper surface and a lower surface of the hermetic sealing lid member.

6. The method for manufacturing the hermetic sealing lid member according to claim 1, wherein
the forming of the Ni plated metal plate includes continuously forming the Ni plated layer on the surface of the metal plate that is belt-like.

7. The method for manufacturing the hermetic sealing lid member according to claim 1, wherein
the forming of the Ni plated metal plate includes setting a thickness of the Ni plated layer to 1% or more and 12.5% or less of a thickness of the metal plate.

8. The method for manufacturing the hermetic sealing lid member according to claim 7, wherein
the forming of the Ni plated metal plate includes setting the thickness of the Ni plated layer to 2.5% or more and 7.5% or less of the thickness of the metal plate.

9. The method for manufacturing the hermetic sealing lid member according to claim 2, wherein
the slitting is performed after the forming of the Ni plated metal plate and before the forming of the hermetic sealing lid member by the punching.

10. The method for manufacturing the hermetic sealing lid member according to claim 2, wherein
the slitting is performed before the forming of the Ni plated metal plate.

11. A method for manufacturing an electronic component housing package, comprising:
forming a Ni plated metal plate by forming a Ni plated layer on a surface of a metal plate having a corrosion resistance;
forming a hermetic sealing lid member by punching the Ni plated metal plate; and
welding the hermetic sealing lid member to an electronic component housing member-in which an electronic component is housed by melting the Ni plated layer of the hermetic sealing lid member.

* * * * *